(12) United States Patent
Lin

(10) Patent No.: US 6,504,108 B1
(45) Date of Patent: Jan. 7, 2003

(54) ELECTRICAL CONNECTOR HAVING STAND-OFFS BETWEEN SOLDER BALLS THEREOF

(75) Inventor: Nick Lin, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/040,347

(22) Filed: Dec. 28, 2001

(51) Int. Cl.$^7$ ................................................. H05K 1/16
(52) U.S. Cl. ...................................... 174/260; 174/260
(58) Field of Search ................................ 174/260, 254, 174/255; 361/792, 793, 794, 795, 767, 768, 770

(56) References Cited

U.S. PATENT DOCUMENTS

| | | | | |
|---|---|---|---|---|
| 5,435,482 A | * | 7/1995 | Variot et al. ................ | 228/106 |
| 5,745,986 A | * | 5/1998 | Variot et al. ................ | 174/260 |
| 5,796,590 A | * | 8/1998 | Klein ........................ | 174/260 |
| 5,989,937 A | * | 11/1999 | Variot et al. ................ | 438/108 |
| 6,084,781 A | * | 7/2000 | Klein ........................ | 174/260 |
| 6,219,912 B1 | * | 4/2001 | Shimizu et al. ............. | 174/250 |
| 6,267,650 B1 | * | 7/2001 | Hembree .................... | 451/388 |
| 6,286,205 B1 | * | 9/2001 | Faraci et al. ........... | 228/180.22 |

* cited by examiner

Primary Examiner—Jose H. Alcala
(74) Attorney, Agent, or Firm—Wei Te Chung

(57) ABSTRACT

A ball grid array (BGA) socket (5) includes an insulative member (52), a number of conductive contacts (54) attached to the insulative member in an array and a number of solder balls (56) respectively attached to corresponding conductive contacts and arranged in an array in accordance with the conductive contacts. The insulative member provides a number of stand-offs (60) on the mounting surface thereof and located in the array of the solder balls. When the BGA socket is located on a printed circuit board (PCB, 80) and heated, the solder balls become soft or melted and the insulative member sinks until the stand-offs bear against the PCB. Since the stand-offs are located in the array of the solder balls, the solder balls are not spaced from the PCB too close or too far, therefore the solder balls close a center of the connector may not be disconnected from corresponding solder pads or interconnect with the adjacent solder balls.

8 Claims, 6 Drawing Sheets

ELECTRICAL CONNECTOR HAVING STAND-OFFS BETWEEN SOLDER BALLS THEREOF

BACKGROUND OF THE INVENTION

1. Field of the Invention

The present invention relates to an electrical connector, and particularly to an electrical connector having stand-offs for securely mounting fusible elements of the connector onto a printed circuit board.

2. Description of the Related Art

Ball Grid Array (BGA) sockets are widely used for electrically connecting an IC package, such as a Center Processing Unit (CPU) package to a circuit substrate, such as a PC board. A typical BGA Socket includes an insulative base defining a number of cavities therethrough, a number of conductive contacts received in corresponding cavities of the base, a number of solder balls attached to corresponding conductive contacts prior to the BGA socket being mounted to a PC board and a cover movably attached onto the base.

The cover defines a number of through-holes in accordance with the cavities of the base so that conductive pins of the CPU package may pass through the cover to engage with the corresponding conductive contacts in the base. When mount the BGA socket onto the PC board, the BGA socket connector is located on the PC board such that each solder ball is in accordance with a corresponding solder pad on the PC board. When heated, the solder balls melt and connect the corresponding solder pads. After cooled and frozen, the solder balls each combine with a corresponding solder pad and establish an electrical connection therebetween.

A typical issue existing in BGA socket is that, when heated, the solder balls melt and may be unable to support the base and the cover thereby being crashed by the base and the cover. After cooled, the adjacent solder balls interconnect each other, which results short circuit between the adjacent conductive pins of the CPU package. A first solution for this issue is to improve the material of solder balls. The solder balls each include a core whose melting point is a little higher than the temperature that the solder balls are heated and a mask enclosing the core whose melting point is a little lower than the temperature that the solder balls are heated. When the solder balls are heated, only the masks melt to combine corresponding solder pads on the PC board, and the cores are hard enough to support the base and the cover. A second solution for the above issue is to provide multiple stand-offs on a mounting surface of the base or the cover, which support the base and the cover and release the solder balls from the burden. The stand-offs are typically located at outer sides of the connector. U.S. Pat. Nos. 6,152,756 and 6,042,413, both issued to Hon Hai Precision Ind. Co. Ltd., disclose two types of such connectors.

Referring to FIGS. 4–6, a conventional BGA socket 1 includes an insulative base 11 receiving a plurality of conductive contacts 112 therein, a cover 13 movably attached onto the base 11 and a driver 14 located between the base 11 and the cover 13 for driving the cover 13 relative to the base 11. Each contact 112 has a solder ball 114 downwardly extending beyond a mounting surface 111 of the base 11 for mounting to a corresponding solder pad 116 on a printed circuit board (PCB) 20. The base 11 provides several stand-offs 117, 118 at outer sides thereof to support the connector 1 when the connector 1 is mounted onto the PCB 20. The base 11 and the cover 13 are manufactured by injecting plastic material into dies. So, the base 11 and the cover 13 may warp after they are released from the dies because of inner stress or when the connector 1 is mounted onto the PCB 20 because of warpage.

The connector 1 may warp upwardly that a center of the connector 1 spaces a larger distance from the PCB 20 than its surround. The solder balls 114 residing at the center of the connector may not be mounted onto corresponding solder pads 116 on the PCB 20, thereby contacts 112 residing at the center of the connector 1 are disconnected from the corresponding solder pads 116. On the other side, the connector 1 may warp downwardly that the center of the connector 1 spaces a smaller distance from the PCB 20 than its surround. When the connector 1 is mounted onto the PCB 20, the solder balls 114 residing at the center of the connector 1 may be crashed by the connector 1 and interconnect with adjacent solder balls 114, thereby inducing short circuits between these solder balls 114. Hence, an improved electrical connector is required to overcome the disadvantages of the prior art.

SUMMARY OF THE INVENTION

A first objective of the present invention is to provide an electronic device including a printed circuit board and an electrical connector that are able to be securely mounted onto the printed circuit board.

A second objective of the present invention is to provide an electrical connector having improved stand-offs so that conductive elements of the connector are able to be securely mounted onto corresponding solder pads on a printed circuit board.

A ball grid array (BGA) socket includes an insulative member, a number of conductive contacts attached to the insulative member in an array and a number of solder balls respectively attached to corresponding conductive contacts and arranged in an array in accordance with the conductive contacts. The solder balls extend away from a mounting surface of the insulative member for mounting onto corresponding solder pads on a printed circuit board (PCB). The insulative member provides a number of stand-offs on the mounting surface thereof and located in the array of the solder balls. When the BGA socket is located on the PCB and heated, the solder balls become soft or melted and the insulative member sinks until the stand-offs bear against the PCB. Since the stand-offs are located in the array of the solder balls, the solder balls are not spaced from the PCB too close or too far, therefore the solder balls may securely mounted to solder pads on the PCB.

Other objects, advantages and novel features of the invention will become more apparent from the following detailed description of the present embodiment when taken in conjunction with the accompanying drawings.

DESCRIPTION OF THE PREFERRED EMBODIMENT

Figure 1:
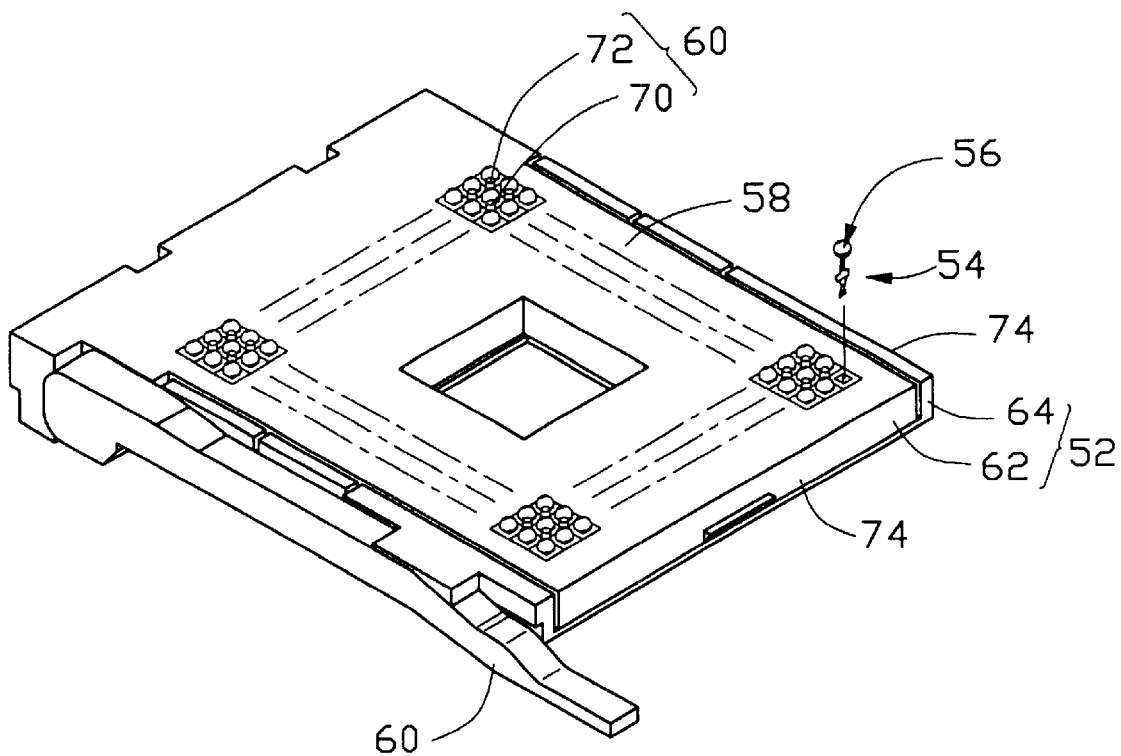
FIG. 1 is a bottom perspective view of an electrical connector of the present invention.

Referring to FIG. 1, an electrical connector 5 comprises an insulative member 52, a plurality of conductive contacts 54 retained in the insulative member 52 in an array and a plurality of fusible elements, for example solder balls, 56 attached to corresponding contacts 54 and extending beyond a mounting surface 58 of the connector 5 for mounting to corresponding solder pads 82 on a printed circuit board (PCB) 80. The solder balls 56 are arranged in an array in accordance with the array of the contacts 54. The insulative member 52 provides a number of stand-offs 60 on the mounting surface 58 thereof. The stand-offs 60 are located in. the array of the solder balls 56 and preferably between corresponding solder balls 56. The stand-offs 60 includes inner stand-offs 70 and outer stand-offs 72 which are closer to outer edges 74 of the insulative member 52 than the inner stand-offs 70. The insulative member 52 includes an insulative base 62, an insulative cover 64 movably attached onto the base 62 and a driver 66 located between the base 62 and the cover 64 for driving the cover 64 along the base 62.

Figure 2:
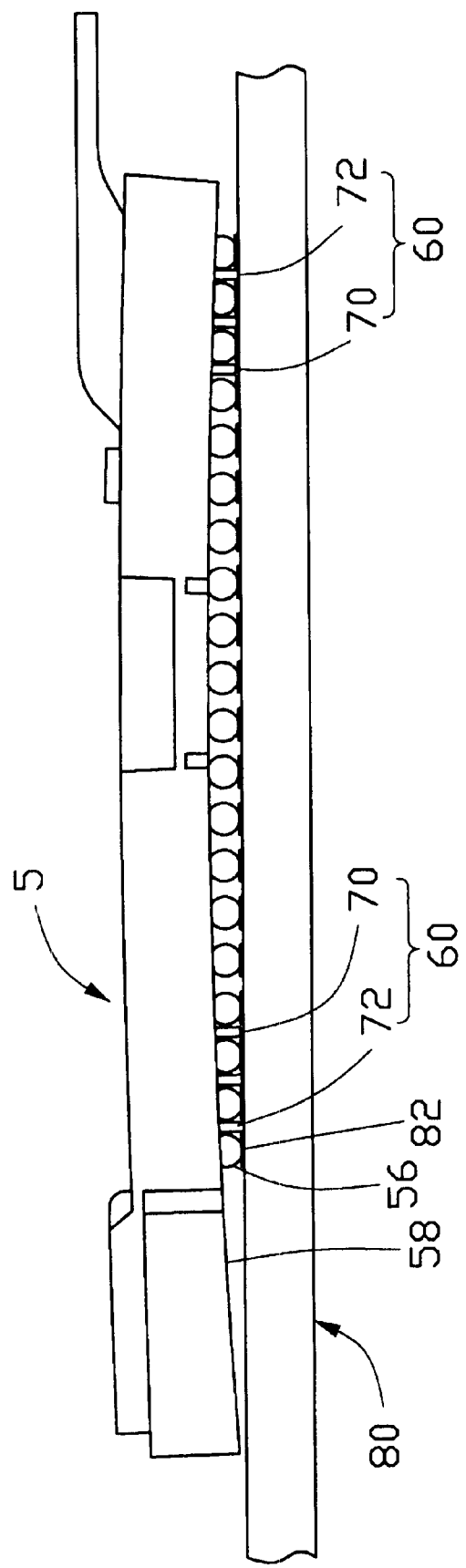
FIG. 2 is a side planar view of the connector in FIG. 1 mounted onto a printed circuit boar herein the connector warps upwardly.
Figure 3:
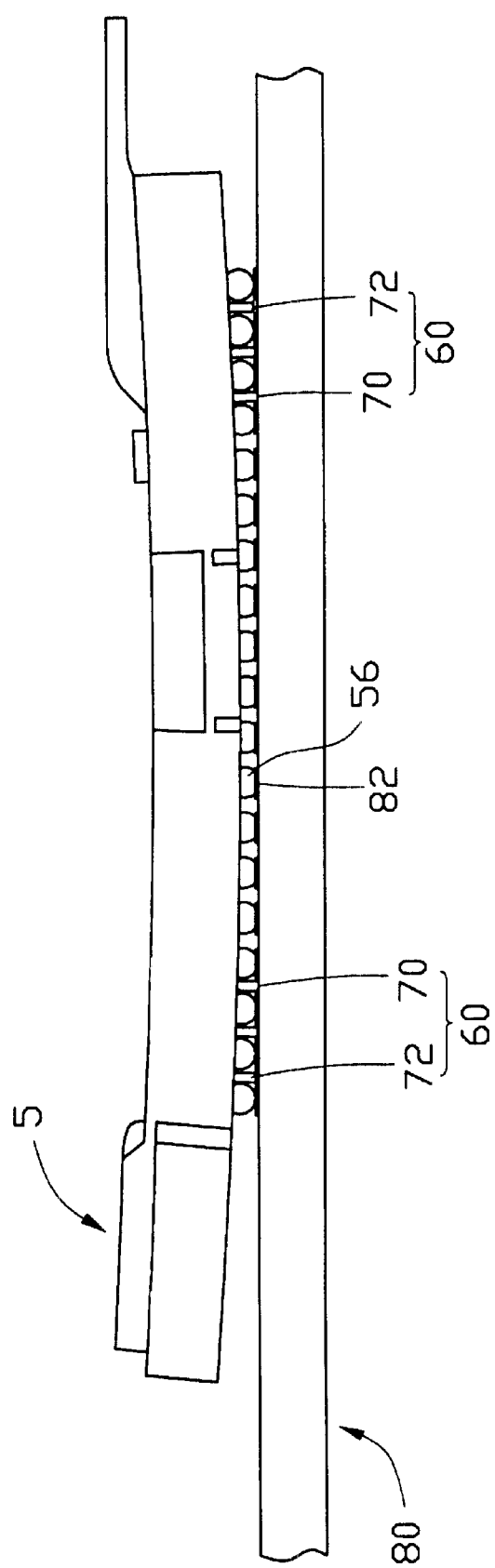
FIG. 3 is a view similar to FIG. 2 but the connector warps downwardly.
Figure 4:
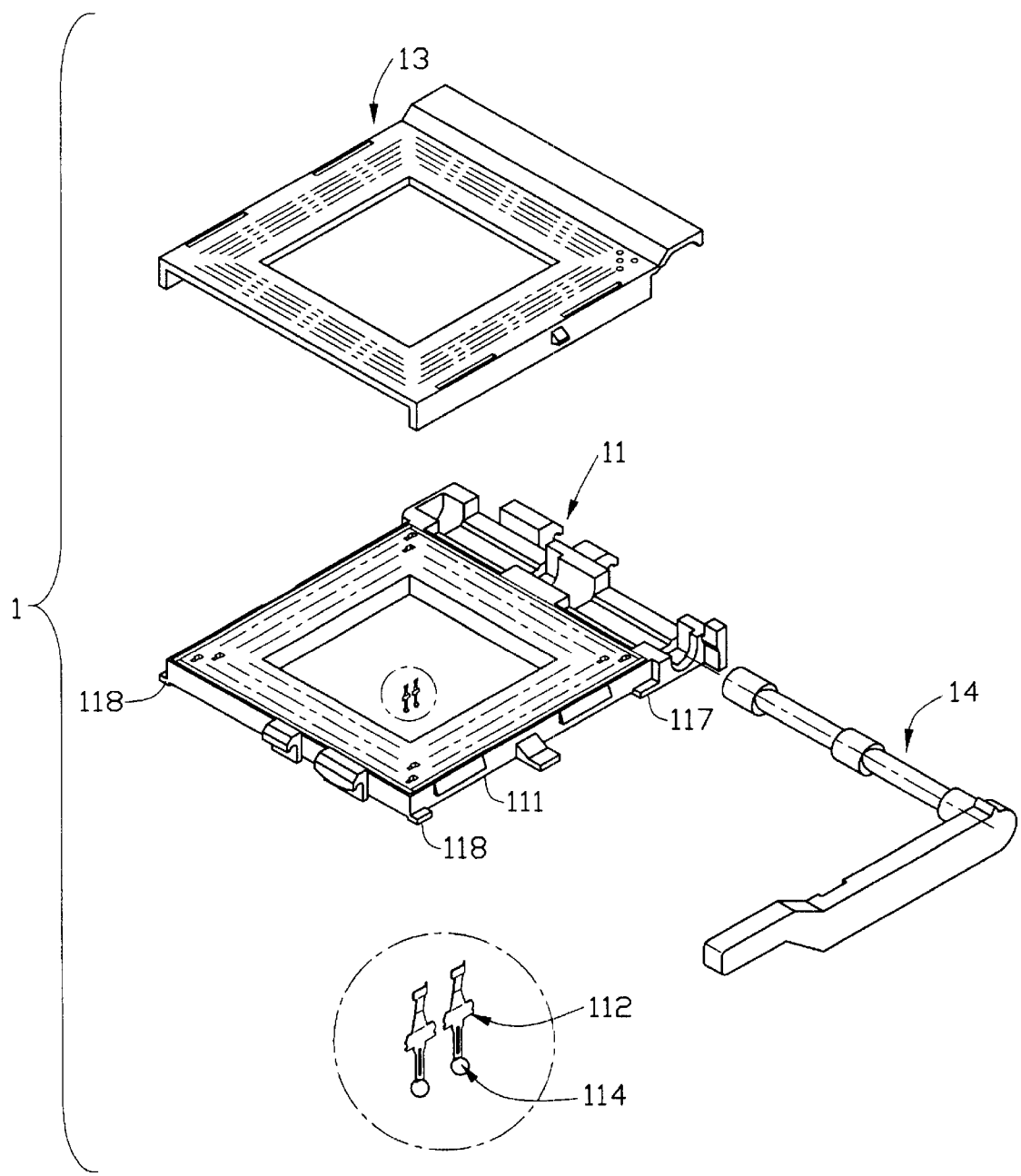
FIG. 4 is an exploded perspective view of a conventional connector.
Figure 5:
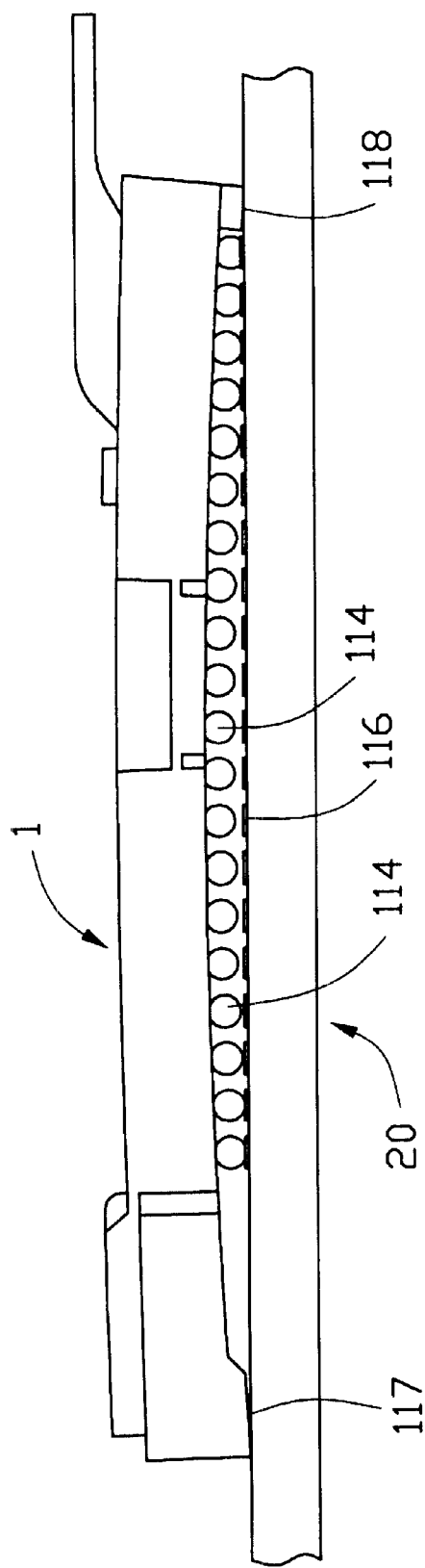
FIG. 5 is a side planar view of the connector in FIG. 4 mounted onto a printed circuit boar the connector warps upwardly.
Figure 6:
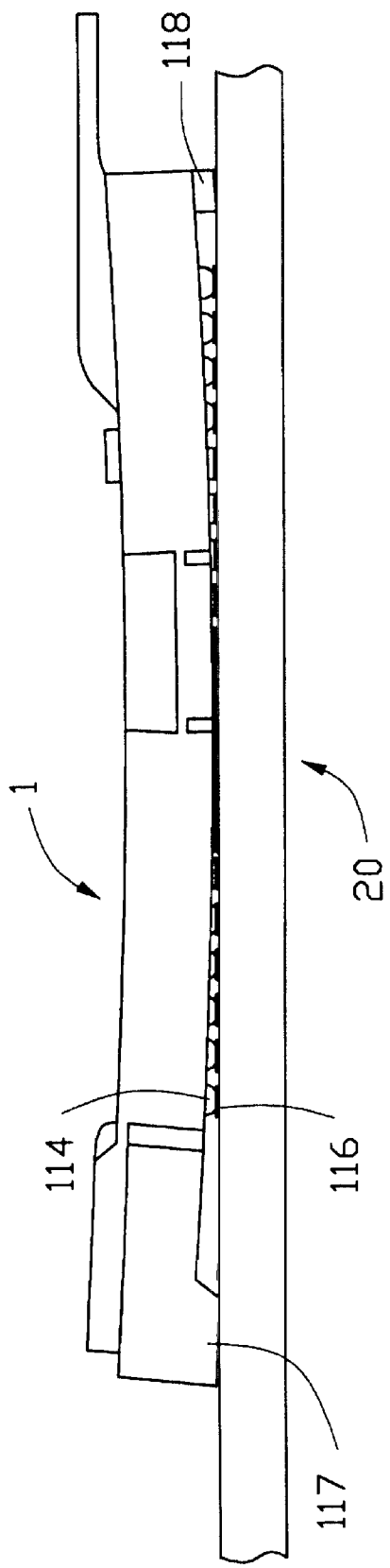
FIG. 6 is a view similar to FIG. 5 but the connector warps downwardly.

Referring to FIGS. 2 and 3, the connector 5 may warp upwardly or downwardly when the base 62 and the cover 64 are manufactured by injecting plastic material into dies or when the connector 5 is mounted onto the PCB 80. When the connector 5 warps upwardly that a center of the connector 5 spaces a larger distance from the PCB 80 than its surround thereof, the outer stand-offs 72 bear against the PCB 80. The center of the connector 5 spaces the PCB 80 a smaller distance than that of the conventional connector 1 because the outer stand-offs 72 are closer to the center of the connector 5 than that of the conventional connector 1. So, the solder balls 56 adjacent to the center of the connector 5 can still connect to corresponding solder pads 82 on the PCB 80. When the connector 5 warps downwardly that the center of the connector 5 spaces a smaller distance from the PCB 80 than its surrounding thereof, the inner stand-offs 70 bear against the PCB 80. The center of the connector 5 spaces the PCB 80 a larger distance than that of the conventional connector 1 because the inner stand-offs 70 are closer to the center of the connector 5 than that of the conventional connector 1. Therefore, the solder balls residing adjacent the center of the connector 5 may not be crashed by the connector 5 and correctly connect with the corresponding solder pads 82 on the PCB 80.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic device comprising:

a printed circuit board; and an electrical connector mountable to the printed circuit board, the electrical connector including:

an insulative member having a mounting surface confronting the printed circuit board;

a plurality of conductive contacts attached to the insulative member in an array; and an array of fusible elements respectively attached to corresponding conductive contacts;

the insulative member providing a number of insulative blocks extending beyond the mounting surface thereof toward the printed circuit board, the blocks being located among the array of the fusible elements, at least some blocks moving toward the printed circuit board until bearing against the printed circuit board when the fusible elements are heated.

2. The electronic device as claimed in claim 1, wherein the fusible elements are solder balls.

3. The electronic device as claimed in claim 1, wherein the insulative member includes an insulative base and an insulative cover movably attached to the insulative base.

4. The electronic device as claimed in claim 3 including an actuator for driving the insulative cover to move along the insulative base.

5. The electronic device as claimed in claim 1, wherein the blocks includes inner blocks that are closer to a center of the electrical connector and outer blocks that are farther from the center of electrical connector, and wherein after the connector is mounted onto the printed circuit board, the inner blocks and the outer blocks may selectively bear against the printed circuit board in accordance with upward warpage of the electrical connector that the center is higher than its surround, or downward warpage of the electrical connector that the center is lower than its surround.

6. An electrical connector comprising:

an insulative member having a mounting surface adapted for mounting to a printed circuit board;

a plurality of conductive contacts attached to the insulative member in an array; and an array of fusible elements respectively attached to corresponding conductive contacts;

the insulative member providing a number of blocks extending beyond the mounting surface thereof, the blocks being located among the array of the fusible elements and being able to bear against the printed circuit board when the fusible elements are heated.

7. The electrical connector as claimed in claim 6, wherein the fusible elements are solder balls.

8. An electrical connector assembly comprising:

a printed circuit board;

an insulative housing defining a mounting surface facing to said printed circuit board;

a plurality of contacts disposed in the housing in matrix;

a fusible element attached to a bottom of each of said contacts; and a number of blocks integrally extending downwardly from said mounting surface among said contacts within a boundary defined by said matrix; wherein said blocks are directly seated upon the printed circuit board after said fusible elements are heated.

* * * * *